(12) United States Patent
Yoshioka et al.

(10) Patent No.: US 12,015,125 B2
(45) Date of Patent: Jun. 18, 2024

(54) NONAQUEOUS ELECTROLYTE SECONDARY BATTERY AND BATTERY MODULE

(71) Applicant: TOYOTA JIDOSHA KABUSHIKI KAISHA, Toyota (JP)

(72) Inventors: Masahiro Yoshioka, Toyota (JP); Yoshitomo Takebayashi, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 18/112,050

(22) Filed: Feb. 21, 2023

(65) Prior Publication Data
US 2023/0198026 A1 Jun. 22, 2023

Related U.S. Application Data

(62) Division of application No. 17/333,388, filed on May 28, 2021, now Pat. No. 11,721,840.

(30) Foreign Application Priority Data

Jul. 1, 2020 (JP) .................................. 2020-114022

(51) Int. Cl.
*H01M 10/0587* (2010.01)
*G01R 31/382* (2019.01)
(Continued)

(52) U.S. Cl.
CPC ...... *H01M 10/0587* (2013.01); *G01R 31/382* (2019.01); *H01M 4/382* (2013.01);
(Continued)

(58) Field of Classification Search
None
See application file for complete search history.

(56) References Cited

U.S. PATENT DOCUMENTS 11,721,840 B2 * 8/2023 Yoshioka ............. H01M 4/382
429/188
2019/0280293 A1 9/2019 Ohsawa et al.

FOREIGN PATENT DOCUMENTS

| JP | 2012-230837 A | 11/2012 |
| JP | 2018-106903 A | 7/2018 |
| JP | 2019-160435 A | 9/2019 |

* cited by examiner

*Primary Examiner* — Lucas J. O'Donnell
(74) *Attorney, Agent, or Firm* — Sughrue Mion, PLLC

(57) ABSTRACT

According to the present disclosure, it is possible to appropriately prevent a shortage of a nonaqueous electrolyte solution in an electrode body and keep battery performance of a nonaqueous electrolyte secondary battery at a favorable state. A nonaqueous electrolyte secondary battery disclosed herein includes an electrode body and a nonaqueous electrolyte solution. The electrode body includes an electrolyte solution passage that is a flow passage through which the nonaqueous electrolyte solution flows between the inside and the outside of the electrode body. When a region of a negative-electrode composite material layer that is in contact with the electrolyte solution passage is referred to as a damming portion and a region that is located on the center side relative to the damming portion is referred to as a liquid retaining portion, the damming portion contains a negative electrode active material of which an electrical potential relative to a positive electrode active material is high and a ratio of expansion or contraction due to an increase or decrease in SOC is high, when compared to a negative electrode active material contained in the liquid retaining portion. With this configuration, the electrolyte solution passage can be closed by the damming portion in a charge state where the damming portion expands, and therefore leakage of the nonaqueous electrolyte solution can be suppressed.

3 Claims, 8 Drawing Sheets

(51) Int. Cl.
*H01M 4/38* (2006.01)
*H01M 4/583* (2010.01)
*H01M 10/44* (2006.01)
*H01M 4/02* (2006.01)

(52) U.S. Cl.
CPC .......... *H01M 4/583* (2013.01); *H01M 10/44* (2013.01); *H01M 2004/027* (2013.01); *H01M 2004/028* (2013.01)

NONAQUEOUS ELECTROLYTE SECONDARY BATTERY AND BATTERY MODULE

CROSS REFERENCE TO RELATED APPLICATIONS

The present application is a Divisional Application of U.S. application Ser. No. 17/333,388 filed on May 28, 2021, which claims priority based on Japanese Patent Application No. 2020-114022 filed on Jul. 1, 2020, the entire contents of which are incorporated herein by reference.

BACKGROUND

1. Technical Field

The present disclosure relates to a nonaqueous electrolyte secondary battery and a battery module including the nonaqueous electrolyte secondary battery.

2. Description of the Related Art

Nonaqueous electrolyte secondary batteries such as lithium-ion secondary batteries have small weights and high energy densities, and therefore are widely used in portable power supplies that are installed in personal computers, portable terminals, and the like and vehicle driving power supplies that are installed in electric vehicles (EVs), hybrid vehicles (HVs), and the like. Such a nonaqueous electrolyte secondary battery includes an electrode body that has a positive electrode and a negative electrode and a nonaqueous electrolyte solution that infiltrates into the electrode body. Also, the electrodes (the positive electrode and the negative electrode) of such a secondary battery respectively include electrode composite material layers that contain electrode active materials. These electrode active materials are granular materials that allow for intercalation and deintercalation of charge carriers (e.g., Li ions). For example, carbon-based active materials that contain carbon (C) and metal-based active materials that contain silicon (Si), tin (Sn), and the like are used as electrode active materials (negative electrode active materials) on the negative electrode side. Japanese Patent Application Publication No. 2019-160435 discloses an example of a nonaqueous electrolyte secondary battery that contains silicon oxide (SiO), which is a metal-based active material, as a negative electrode active material.

Incidentally, in a nonaqueous electrolyte secondary battery of this type, the negative electrode active material expands or contracts as a result of intercalation or deintercalation of charge carriers in charging or discharging. Therefore, if rapid charging and discharging (high-rate charging and discharging) are repeated, the nonaqueous electrolyte solution in the electrode body may be extruded to the outside due to a rapid change in the volume of a negative-electrode composite material layer. If the nonaqueous electrolyte solution inside the electrode body consequently runs short, there is a risk of the occurrence of performance degradation (hereinafter also referred to as "high-rate degradation") such as an increase in the battery resistance. Various measures have been conventionally proposed to prevent such high-rate degradation due to leakage of the nonaqueous electrolyte solution. For example, in Japanese Patent Application Publication No. 2012-230837, when a battery pack is built by collectively binding a plurality of secondary batteries, spacers are arranged between the secondary batteries so that a binding pressure is applied to end portions of power generation elements (electrode bodies) and is not applied to center portions of the power generation elements.

SUMMARY

However, higher battery performance is required in recent years, and there are demands for development of a nonaqueous electrolyte secondary battery that can more appropriately prevent a shortage of the nonaqueous electrolyte solution in the electrode body to keep battery performance at a favorable state. The inventor of the present disclosure carried out studies to satisfy such requirement and thought that, although conventional technologies such as that disclosed in Japanese Patent Application Publication No. 2012-230837 can suppress the occurrence of high-rate degradation due to leakage of the nonaqueous electrolyte solution, it is difficult to solve occurred high-rate degradation and recover the battery performance.

Specifically, the inside and the outside of a commonly used electrode body communicate with each other via a flow passage (electrolyte solution passage) through which the nonaqueous electrolyte solution flows. If applied pressure is concentrated on a specific region of the electrode body as is the case with the technology described in Japanese Patent Application Publication No. 2012-230837, the electrolyte solution passage is closed, and accordingly, the occurrence of high-rate degradation due to leakage of the nonaqueous electrolyte solution can be suppressed. However, if the electrolyte solution passage is closed, infiltration of the nonaqueous electrolyte solution into the electrode body is also suppressed, and this makes it very difficult to perform recovery processing for causing a leaked portion of the nonaqueous electrolyte solution to again infiltrate. In view of the foregoing, the inventor of the present disclosure thought that a technology that not only suppresses leakage of the nonaqueous electrolyte solution to the outside of the electrode body but also facilitates infiltration of the nonaqueous electrolyte solution into the electrode body is necessary in order to keep battery performance of a nonaqueous electrolyte secondary battery at a favorable state.

A technology disclosed herein was made to solve the problems described above, and has an object of appropriately preventing a shortage of the nonaqueous electrolyte solution in the electrode body and keeping battery performance of the nonaqueous electrolyte secondary battery at a favorable state.

To achieve the object described above, a nonaqueous electrolyte secondary battery having the following configuration is provided.

A nonaqueous electrolyte secondary battery disclosed herein includes an electrode body in which a positive electrode, a negative electrode, and a separator are overlaid on each other and a nonaqueous electrolyte solution that infiltrates into the electrode body. The positive electrode of the nonaqueous electrolyte secondary battery is formed by coating a surface of a band-shaped positive-electrode current collecting foil with a positive-electrode composite material layer that contains a positive electrode active material, and the negative electrode is formed by coating a surface of a band-shaped negative-electrode current collecting foil with a negative-electrode composite material layer that contains a negative electrode active material. The electrode body includes an electrolyte solution passage that is a flow passage through which the nonaqueous electrolyte solution flows between the inside and the outside of the electrode body. When a region of the negative-electrode composite material layer that is in contact with the electrolyte solution passage is referred to as a damming portion, and a region of the negative-electrode composite material layer that is located on a center side relative to the damming portion is referred to as a liquid retaining portion, the damming portion contains a negative electrode active material of which an electrical potential relative to the positive electrode active material is high and a ratio of expansion or contraction due to an increase or decrease in SOC (State Of Charge) is high, when compared to a negative electrode active material contained in the liquid retaining portion.

In the electrode body of the nonaqueous electrolyte secondary battery configured as described above, the damming portion is formed in the region that is in contact with the electrolyte solution passage. The damming portion contains the negative electrode active material of which the electrical potential relative to the positive electrode active material is relatively high, and therefore charge carriers are preferentially supplied to the damming portion during charging, and the damming portion expands earlier than the liquid retaining portion. Furthermore, the ratio of expansion or contraction of the negative electrode active material contained in the damming portion due to an increase or decrease in SOC is higher than that of the negative electrode active material contained in the liquid retaining portion. Therefore, in a charge state where the damming portion expands, the damming portion that became thicker than the liquid retaining portion closes the electrolyte solution passage. On the other hand, in a charge state where the damming portion contracts, the electrolyte solution passage is opened as a result of the damming portion becoming thinner than the liquid retaining portion. Therefore, in the nonaqueous electrolyte secondary battery configured as described above, it is possible to suppress leakage of the nonaqueous electrolyte solution from the inside of the electrode body by performing charging and discharging while maintaining a charge region (hereinafter referred to as a "normal use range") in which the volume of the damming portion hardly changes in a state where the damming portion has sufficiently expanded and expansion and contraction of the liquid retaining portion occur. On the other hand, it is possible to easily cause the nonaqueous electrolyte solution to infiltrate into the electrode body and recover battery performance of the nonaqueous electrolyte secondary battery by performing charging and discharging while maintaining a charge region (hereinafter referred to as a "recovery range") in which the volume of the liquid retaining portion hardly changes in a state where the liquid retaining portion has sufficiently contracted and expansion and contraction of the damming portion occur. As described above, according to the technology disclosed herein, it is possible to appropriately prevent a shortage of the nonaqueous electrolyte solution in the electrode body and to keep battery performance of the nonaqueous electrolyte secondary battery at a favorable state.

In one aspect of the nonaqueous electrolyte secondary battery disclosed herein, the positive-electrode composite material layer contains a positive electrode active material that contains lithium (Li).

The technology disclosed herein can be suitably applied to a nonaqueous electrolyte secondary battery (i.e., a lithium-ion secondary battery) in which a positive electrode active material containing Li is used, for example.

In the above-described aspect in which the positive electrode active material containing Li is used, it is preferable that the liquid retaining portion contains a carbon-based active material that contains carbon (C).

The carbon-based active material tends to make a charge reaction and a discharge reaction relatively stable, and therefore is suitable as the negative electrode active material used in the liquid retaining portion in which the charge reaction and the discharge reaction mainly occur.

In the aspect in which the carbon-based active material is used in the liquid retaining portion, it is preferable that the damming portion contains a negative electrode active material that has an electrical potential of at least 0.1 V relative to lithium.

The carbon-based active material has an electrical potential of about 0.05 V relative to Li. From the standpoint of widening the normal use range by facilitating expansion of the damming portion relative to the liquid retaining portion containing such a carbon-based active material, it is preferable that the active material contained in the damming portion has an electrical potential of at least 0.1 V relative to Li.

Also, in the above-described aspect in which the carbon-based active material is used in the liquid retaining portion, it is preferable that the damming portion contains a negative electrode active material of which the ratio of expansion or contraction due to an increase or decrease in SOC is at least 150%.

The ratio of expansion or contraction of the carbon-based active material due to an increase or decrease in SOC is about 12%. From the standpoint of appropriately closing the electrolyte solution passage by causing the damming portion to largely expand relative to the liquid retaining portion containing such a carbon-based active material, it is preferable that the ratio of expansion or contraction of the active material contained in the damming portion due to an increase or decrease in SOC is at least 150%. Note that, in the present specification, the "ratio of expansion or contraction due to an increase or decrease in SOC (also simply referred to as the "ratio of expansion or contraction")" indicates the amount of increase in the volume of the negative electrode active material when SOC is varied from 0% to 100%.

Also, in the above-describe aspect in which the carbon-based active material is used in the liquid retaining portion, it is preferable that the damming portion contains a metal-based active material that contains at least one element selected from the group consisting of silicon (Si), tin (Sn), antimony (Sb), and bismuth (Bi).

Electrical potentials of these metal-based active materials relative to Li are higher than that of the carbon-based active material, and ratios of expansion or contraction of these metal-based active materials are higher than that of the carbon-based active material. Therefore, if any of these metal-based active materials is contained in the damming portion, the electrolyte solution passage can be appropriately closed and opened through the SOC adjustment described above.

Also, in the above-described aspect in which the metal-based active material is used in the damming portion, it is preferable that the damming portion contains a negative electrode active material that is obtained by mixing a carbon-based active material containing carbon (C) and the metal-based active material.

In this case, a charge reaction and a discharge reaction that occur in the damming portion can be stabilized while effects of the technology disclosed herein being appropriately exhibited.

In the aspect in which the mixed material containing the carbon-based active material and the metal-based active material is used in the damming portion, it is preferable that an amount of the metal-based active material relative to a total amount of the negative electrode active material contained in the damming portion is at least 0.5 wt % and no greater than 3.0 wt %.

From the standpoint of appropriately closing and opening the electrolyte solution passage through adjustment of SOC, it is preferable that the amount of the metal-based active material contained in the mixed material is at least 0.5 wt %. On the other hand, if the amount of the metal-based active material is too large, the damming portion excessively expands, and there is a possibility of the battery capacity being reduced due to breakage of a conductive path. In view of this, it is preferable that the amount of the metal-based active material is no greater than 3.0 wt %.

The electrode body of the nonaqueous electrolyte secondary battery disclosed herein may also be a wound electrode body that is obtained by layering and winding the positive electrode, the negative electrode, and the separator. Such a wound electrode body includes the electrolyte solution passage in each of both side surfaces in a winding axis direction. In such a case, it is preferable that the damming portion is formed in each of both end portions of the negative-electrode composite material layer in the winding axis direction.

In a case where the wound electrode body configured as described above is used, leakage and infiltration of the nonaqueous electrolyte solution can be appropriately controlled if damming portions are formed in the both end portions of the negative-electrode composite material layer in the winding axis direction. Note that the wound electrode body includes the electrolyte solution passages at only two positions, and therefore it is relatively difficult for the nonaqueous electrolyte solution to infiltrate. However, when the damming portions are caused to contract, the electrolyte solution passages are opened wider in the nonaqueous electrolyte secondary battery disclosed herein, when compared to conventional batteries, and therefore the nonaqueous electrolyte solution can easily infiltrate into the wound electrode body.

Also, a battery module is provided as another aspect of the technology disclosed herein. The battery module includes a power supply configured to be electrically connected to an external device and a control unit configured to control charging and discharging of the power supply. The power supply of the battery module includes the nonaqueous electrolyte secondary battery according to any of the aforementioned aspects. Also, the control unit includes a degradation detection unit that detects high-rate degradation of the power supply, an SOC measurement unit that measures SOC of the power supply, and an SOC adjustment unit that adjusts the SOC by controlling charging and discharging of the power supply. During a period for which it is determined that the high-rate degradation is not occurring based on a result of detection performed by the degradation detection unit, the SOC adjustment unit maintains SOC of the power supply so that the damming portion is thicker than the liquid retaining portion, and upon determining that the high-rate degradation has occurred based on a result of detection performed by the degradation detection unit, the SOC adjustment unit reduces SOC of the power supply so that the damming portion becomes thinner than the liquid retaining portion.

During the period for which it is determined that high-rate degradation is not occurring in the power supply, the battery module configured as described above keeps SOC of the power supply in the normal use range so that the damming portion is thicker than the liquid retaining portion. Thus, the electrolyte solution passage is closed to suppress leakage of the nonaqueous electrolyte solution to the outside of the electrode body. On the other hand, upon determining that high-rate degradation has occurred in the power supply, the battery module configured as described above reduces SOC of the power supply to the recovery range so that the damming portion becomes thinner than the liquid retaining portion. Thus, the electrolyte solution passage is opened, and consequently the nonaqueous electrolyte solution infiltrates into the electrode body and high-rate degradation is solved. As described above, according to the battery module disclosed herein, the effects of the nonaqueous electrolyte secondary battery described above can be appropriately exhibited and battery performance of the battery can be kept at a favorable state.

In one aspect of the battery module disclosed herein, the SOC measurement unit measures SOC of the power supply by integrating current values during charging and discharging of the power supply.

SOC of the power supply can be calculated by integrating current values, for example.

In one aspect of the battery module disclosed herein, the degradation detection unit may calculate an evaluation value D that is a numerical value expressing high-rate degradation of the power supply. In this case, during a period for which an integrated value $\Sigma D$ of the evaluation value D is smaller than a degradation determination reference value $T_{D1}$, the SOC adjustment unit adjusts SOC of the power supply so that the damming portion is thicker than the liquid retaining portion, and when the integrated value $\Sigma D$ of the evaluation value D exceeds the degradation determination reference value $T_{D1}$, the SOC adjustment unit reduces SOC of the power supply so that the damming portion becomes thinner than the liquid retaining portion.

As described above, if the state of high-rate degradation of the power supply is expressed with a numerical value, it is possible to appropriately switch between two operation modes, i.e., between normal operation in which charging and discharging are performed while keeping SOC in the normal use range and recovery processing in which charging and discharging are performed while keeping SOC in the recovery range.

DETAILED DESCRIPTION

Figure 1:
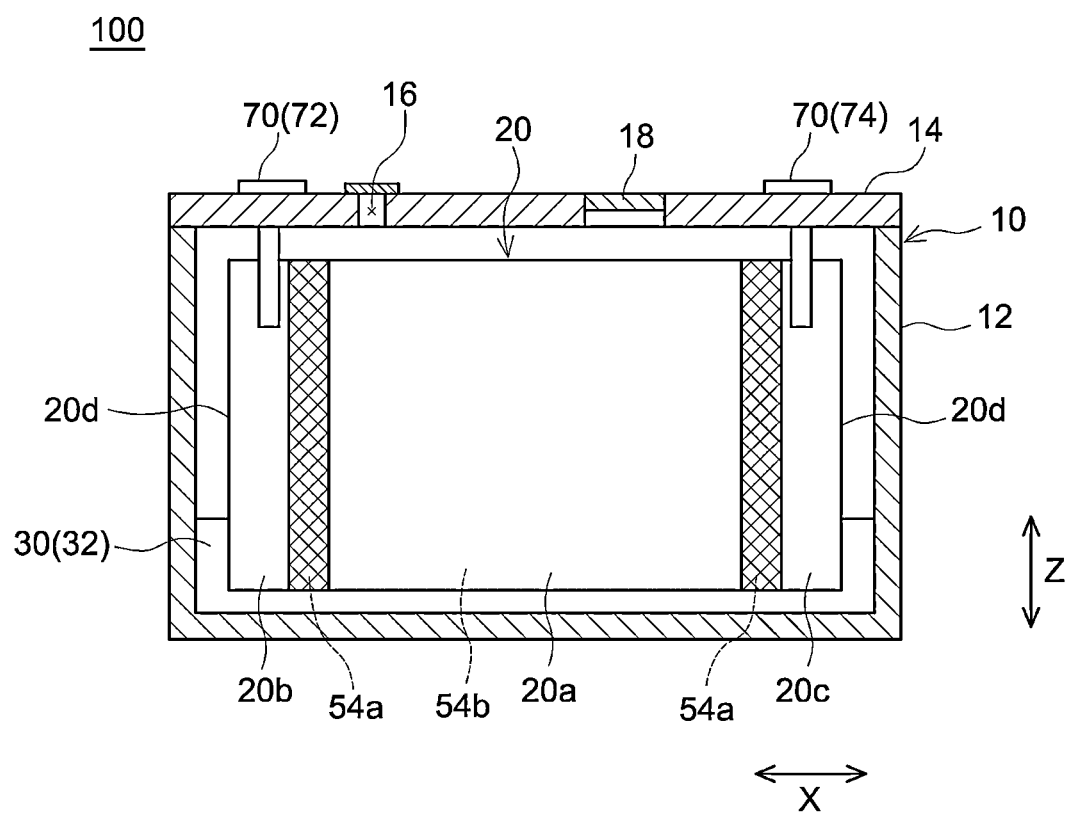
FIG. 1 is a cross-sectional view schematically showing an internal configuration of a lithium-ion secondary battery according to an embodiment.

The following describes an embodiment of the technology disclosed herein with reference to the drawings. However, the following embodiment is not intended to limit the technology disclosed herein. Note that matter (e.g., a procedure for manufacturing a nonaqueous electrolyte secondary battery) that is necessary to implement the technology disclosed herein other than matter particularly referred to in the present specification can be grasped based on conventional technologies in the art. That is, the technology disclosed herein can be implemented based on the contents explicitly described in the present specification and common technical knowledge in the art.

Also, members and portions that have the same functions are denoted by the same reference signs in the drawings referred to in the present specification. Furthermore, dimensional relationships (lengths, widths, thicknesses, etc.) shown in the drawings do not reflect actual dimensional relationships. The sign X in each drawing indicates a "width direction (of a battery)", the sign Y indicates a "depth direction (of the battery)", and the sign Z indicates a "height direction (of the battery)". However, these directions are defined for the sake of convenience of description, and are not intended to limit the manner of installation when a nonaqueous electrolyte secondary battery disclosed herein is used.

Note that the "nonaqueous electrolyte secondary battery" referred to in the present specification means a secondary battery in which a nonaqueous electrolyte solution is used as an electrolyte. Also, a "secondary battery" means a battery that can be repeatedly charged and discharged as a result of charge carriers moving between a positive electrode and a negative electrode. An example of such a secondary battery is a lithium-ion secondary battery in which a positive electrode active material that contains lithium (Li) is used and charge carriers are lithium ions ($Li^+$). In the following embodiment, such a lithium-ion secondary battery is described as an example.

1. Lithium-Ion Secondary Battery

Figure 2:
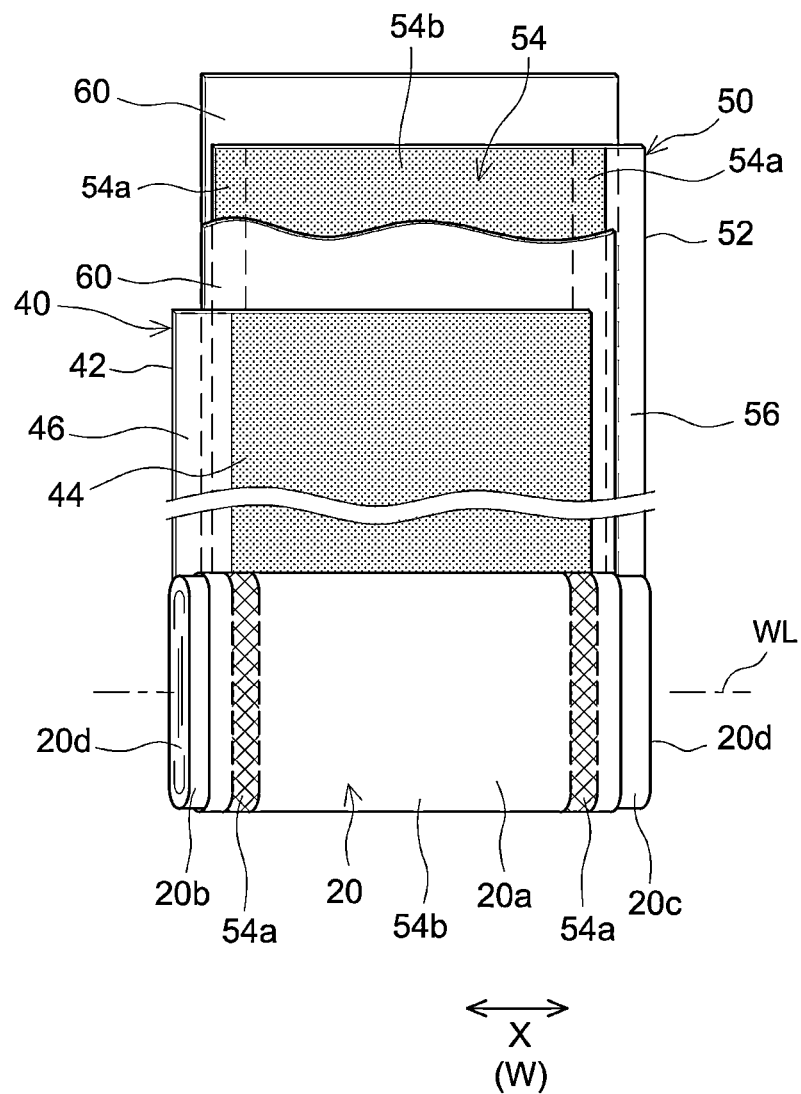
FIG. 2 is a perspective view schematically showing an electrode body of the lithium-ion secondary battery according to the embodiment.
Figure 3:
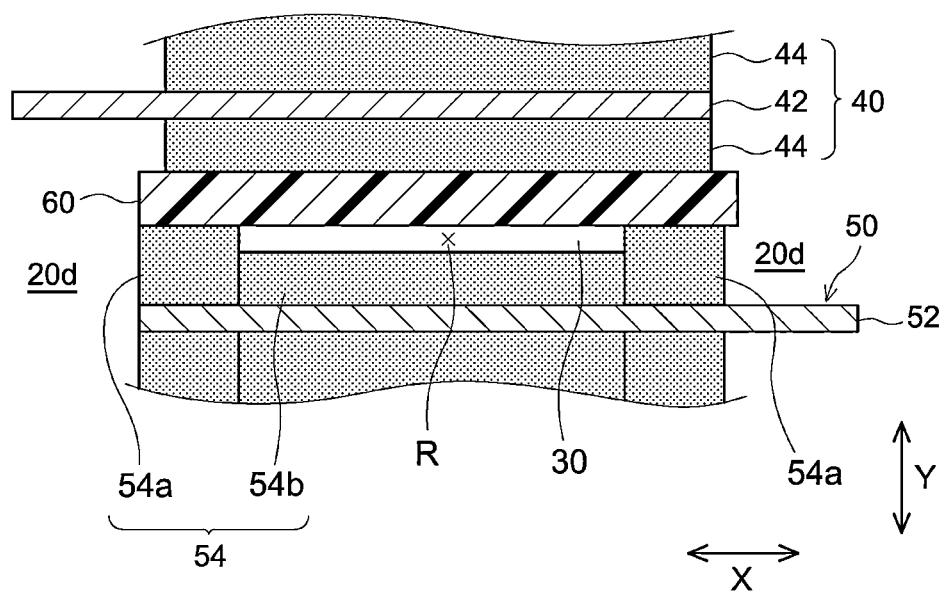
FIG. 3 is a diagram schematically showing a cross section of the electrode body when SOC of the lithium-ion secondary battery according to the embodiment is in a normal use range.
Figure 4:
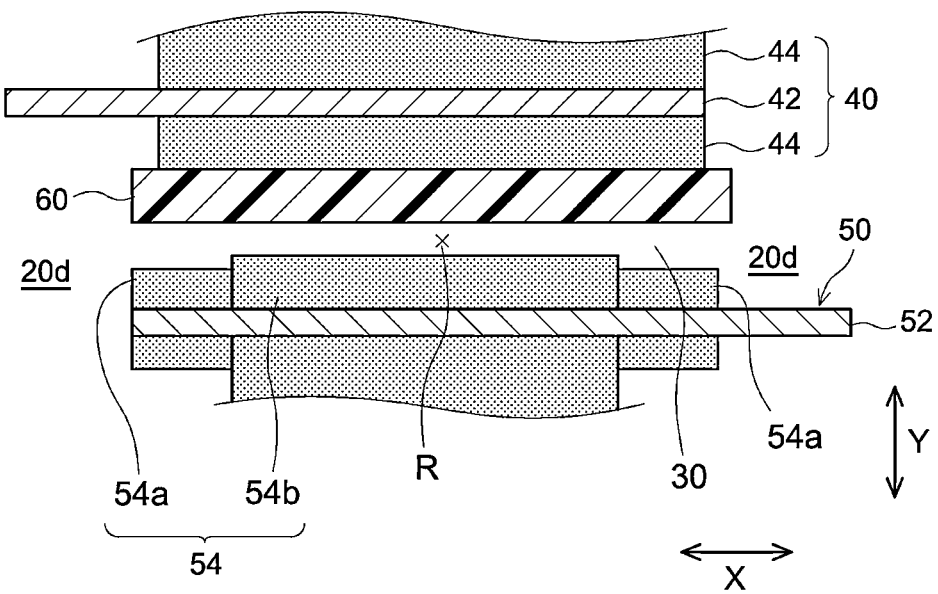
FIG. 4 is a diagram schematically showing a cross section of the electrode body when SOC of the lithium-ion secondary battery according to the embodiment is in a recovery range.

FIG. 1 is a cross-sectional view schematically showing an internal configuration of a lithium-ion secondary battery according to the present embodiment. FIG. 2 is a perspective view schematically showing an electrode body of the lithium-ion secondary battery according to the present embodiment. FIG. 3 is a diagram schematically showing a cross section of the electrode body when SOC of the lithium-ion secondary battery according to the present embodiment is in a normal use range. FIG. 4 is a diagram schematically showing a cross section of the electrode body when SOC of the lithium-ion secondary battery according to the present embodiment is in a recovery range.

(1) Overall Configuration

As shown in FIG. 1, a lithium-ion secondary battery 100 according to the present embodiment includes an electrode body 20 and a nonaqueous electrolyte solution 30. The electrode body 20 and the nonaqueous electrolyte solution 30 are housed in a battery case 10. Also, the lithium-ion secondary battery 100 includes a pair of electrode terminals 70 constituted by a positive electrode terminal 72 and a negative electrode terminal 74 although a detailed description thereof is omitted because this configuration does not limit the technology disclosed herein. Ends on one side of these electrode terminals 70 are electrically connected to the electrode body 20 in the battery case 10. Ends on the other side of the electrode terminals 70 are exposed to the outside of the battery case 10. With this configuration, the electrode body 20 housed in the battery case 10 can be electrically connected to an external device such as a motor of a vehicle.

(2) Battery Case

As described above, the battery case 10 is a container that houses the electrode body 20 and the nonaqueous electrolyte solution 30. The battery case 10 is a rectangular container that has an interior space, and includes a box-shaped case main body 12 that has an opening in an upper surface and a plate-shaped lid body 14 that closes the opening in the upper surface of the case main body 12. The battery case 10 is preferably made of a metal material (e.g., aluminum or an aluminum alloy) that has a small weight and good heat conductivity. Also, a liquid inlet 16 for introducing the nonaqueous electrolyte solution 30 into the battery case 10 is provided in the lid body 14 of the battery case 10. The liquid inlet 16 is sealed after the nonaqueous electrolyte solution 30 is introduced. Also, a safety valve 18 is provided in the lid body 14. The safety valve 18 is opened when the internal pressure of the battery case 10 has rapidly increased, and has a function of reducing the internal pressure of the battery case 10.

(3) Electrode Body

As shown in FIG. 2, the electrode body 20 is configured by overlaying a positive electrode 40, a negative electrode 50, and separators 60 on each other. In the present embodiment, the wound electrode body 20 obtained by layering and winding the positive electrode 40, the negative electrode 50, and the separators 60 is used as the electrode body. Specifically, the wound electrode body 20 is formed by forming a band-shaped laminate in which the positive electrode 40 and the negative electrode 50 are stacked via two separators 60 and winding the laminate. Note that, in the present embodiment, the wound electrode body 20 is housed in the battery case 10 (see FIG. 1) such that a winding axis WL of the wound electrode body 20 extends along the width direction X of the battery. In other words, the lithium-ion secondary battery 100 according to the present embodiment is built such that a winding axis direction W and the width direction X are the same direction.

A core portion 20a in which a positive-electrode composite material layer 44 and a negative-electrode composite material layer 54, which will be described later, face each other is formed in a center portion of the wound electrode body 20 in the winding axis direction W (width direction X). A charge reaction and a discharge reaction occur in the core portion 20a of the wound electrode body 20. Also, a positive electrode connection portion 20b that is connected to the positive electrode terminal 72 is formed in an end portion of the wound electrode body 20 on one side of the winding axis direction W. Also, a negative electrode connection portion 20c that is connected to the negative electrode terminal 74 is formed in an end portion of the wound electrode body 20 on the other side of the winding axis direction W. Also, both end surfaces of the wound electrode body 20 in the winding axis direction W are open to the outside. The nonaqueous electrolyte solution 30 flows between the inside and the outside of the wound electrode body 20 via the both end surfaces in the winding axis direction W. That is, in the present embodiment, electrolyte solution passages 20d are formed in the both end surfaces of the wound electrode body 20.

(a) Positive Electrode

Next, each member constituting the electrode body 20 will be described. The positive electrode 40 includes a band-shaped positive-electrode current collecting foil 42 and the positive-electrode composite material layer 44 coating a surface (e.g., both surfaces) of the positive-electrode current collecting foil 42. A side edge portion (a left side edge portion in FIG. 2) of the positive electrode 40 on one side of the width direction X is not coated with the positive-electrode composite material layer 44 to provide a positive electrode exposed portion 46 in which the positive-electrode current collecting foil 42 is exposed. When the wound electrode body 20 is formed, the positive electrode exposed portion 46 is layered and wound in a state of extending from the negative electrode 50. Thus, the positive electrode connection portion 20b is formed in the end portion of the wound electrode body 20 on one side of the winding axis direction W.

Also, a granular positive electrode active material is contained in the positive-electrode composite material layer 44. There is no particular limitation on the material of the positive electrode active material, and conventionally known materials can be used with no particular limitation. Note that a positive electrode active material that contains lithium (Li) is used in a case where a lithium-ion secondary battery is built as is the case with the present embodiment. Examples of positive electrode active materials containing Li include lithium transition metal complex oxides such as a lithium-nickel-manganese complex oxide, a lithium-nickel-cobalt-alumina complex oxide, and a lithium-nickel-cobalt-manganese complex oxide. Note that the positive-electrode composite material layer 44 may also contain two or more positive electrode active materials of different types. Also, the positive-electrode composite material layer 44 may also contain a conductive material, a binder, and the like as components other than the positive electrode active material. Examples of conductive materials include carbon black such as acetylene black (AB) and ketjen black and carbon materials such as activated carbon and graphite. Examples of binders include halogenated vinyl resins such as polyvinylidene fluoride (PVdF) and polyalkylene oxides such as polyethylene oxide (PEO). Note that conventionally known materials can be used as components other than the positive electrode active material with no particular limitation, and the components do not limit the technology disclosed herein.

(b) Negative Electrode

The negative electrode 50 includes a band-shaped negative-electrode current collecting foil 52 and the negative-electrode composite material layer 54 coating a surface (e.g., both surfaces) of the negative-electrode current collecting foil 52. A side edge portion (a right side edge portion in FIG. 2) of the negative electrode 50 on the other side of the width direction X is not coated with the negative-electrode composite material layer 54 to provide a negative electrode exposed portion 56 in which the negative-electrode current collecting foil 52 is exposed. When the wound electrode body 20 is formed, the negative electrode exposed portion 56 is layered and wound in a state of extending from the positive electrode 40. Thus, the negative electrode connection portion 20c is formed in the end portion of the wound electrode body 20 on the other side of the winding axis direction W.

Also, granular negative electrode active materials are contained in the negative-electrode composite material layer 54. There is no particular limitation on the materials of the negative electrode active materials so long as effects of the technology disclosed herein are not hindered. For example, in a case where a lithium-ion secondary battery is to be built, carbon-based active materials containing carbon (C) and metal-based active materials containing metallic elements can be used as negative electrode active materials. Examples of carbon-based active materials include graphite, hard carbon, soft carbon, and amorphous coated graphite. Also, metal simple substances and metal oxides containing elements selected from the group consisting of silicon (Si), tin (Sn), antimony (Sb), bismuth (Bi), titanium (Ti), and germanium (Ge) can be preferably used as metal-based active materials. The negative-electrode composite material layer 54 may also contain a binder, a thickener, and the like as additives other than the negative electrode active materials. Styrene-butadiene rubber (SBR) or the like can be used as the binder. Carboxymethyl cellulose (CMC) or the like can be used as the thickener. Note that conventionally known materials can be used as components other than the negative electrode active materials with no particular limitation, and the components do not limit the technology disclosed herein.

Also, the lithium-ion secondary battery 100 according to the present embodiment is characterized in that damming portions 54a and a liquid retaining portion 54b are formed in the negative-electrode composite material layer 54 and different negative electrode active materials are used in respective regions. This characteristic will be described later in detail.

(c) Separator

The separators 60 are insulation members interposed between the positive electrode 40 and the negative electrode 50. Micropores through which charge carriers (lithium ions) can pass are formed in the separators 60. As a result of the nonaqueous electrolyte solution 30 infiltrating into the electrode body 20 and filling the micropores in the separators 60, charge carriers can move between the positive electrode 40 and the negative electrode 50. Note that conventionally known materials can be used as the material of the separators 60 with no particular limitation, and the material does not limit the technology disclosed herein, and therefore a detailed description thereof is omitted.

(4) Nonaqueous Electrolyte Solution

As shown in FIG. 1, the nonaqueous electrolyte solution 30 is housed in the battery case 10 together with the electrode body 20 and infiltrates into the electrode body 20. Note that not the entire portion of the nonaqueous electrolyte solution 30 needs to infiltrate into the electrode body 20. For example, a portion of the nonaqueous electrolyte solution 30 may also be present as an extra electrolyte solution 32 on the outside of the electrode body 20 (i.e., between the electrode body 20 and the battery case 10). If an introduction amount of the nonaqueous electrolyte solution 30 is set such that there is the extra electrolyte solution 32, the extra electrolyte solution 32 can infiltrate into the electrode body 20 when the nonaqueous electrolyte solution 30 in the electrode body 20 runs short. In particular, in the lithium-ion secondary battery 100 according to the present embodiment, the nonaqueous electrolyte solution 30 can easily infiltrate into the electrode body 20, and accordingly, the effect of the presence of the extra electrolyte solution 32 can be more effectively exhibited.

The nonaqueous electrolyte solution 30 is prepared by dissolving a supporting electrolyte in a nonaqueous solvent. Note that there is no particular limitation on components of the nonaqueous electrolyte solution 30, and conventionally known materials can be used with no particular limitation. For example, carbonate-based solvents such as ethylene carbonate (EC), dimethyl carbonate (DMC), and ethyl methyl carbonate (EMC) can be used as nonaqueous solvents. Examples of nonaqueous solvents other than carbonate-based solvents include ether-based solvents, ester-based solvents, nitrile-based solvents, sulfone-based solvents, and lactone-based solvents. The nonaqueous electrolyte solution 30 may also contain two or more types of nonaqueous solvents. For example, it is also possible to use a mixed solvent obtained by mixing EC, DMC, and EMC at a predetermined ratio. On the other hand, $LiPF_6$, $LiBF_4$, or the like is used as the supporting electrolyte. Note that a suitable molar concentration of the supporting electrolyte is about 0.5 mol/L to 5 mol/L (e.g., 1 mol/L).

(5) Regions of Negative-Electrode Composite Material Layer

As described above, the damming portions 54a and the liquid retaining portion 54b are provided in the negative-electrode composite material layer 54 in the present embodiment, and different negative electrode active materials are contained in the respective regions. Specifically, the damming portions 54a are formed in regions of the negative-electrode composite material layer 54 that are in contact with the electrolyte solution passages 20d, and the liquid retaining portion 54b is formed in a region that is located on the center side relative to the damming portions 54a. More specifically, the damming portions 54a are continuously formed along the longitudinal direction of the band-shaped negative electrode 50 in both end portions of the negative-electrode composite material layer 54 in the width direction X (see FIG. 2). Accordingly, in the wound electrode body 20, the damming portions 54a are interposed between the outside of the electrode body 20 and the liquid retaining portion 54b, and serve as regions that control closing and opening of the electrolyte solution passages 20d. On the other hand, the liquid retaining portion 54b is located in a center portion of the core portion 20a and serves as a site at which a charge reaction and a discharge reaction mainly occur.

When the entire length of the electrode body 20 in the width direction X is taken to be 100%, the length of the damming portions 54a is preferably at least 1%, more preferably at least 2.5%, and particularly preferably at least 5%. With this configuration, leakage of the nonaqueous electrolyte solution 30 can be more effectively prevented when the damming portions 54a are caused to expand. On the other hand, if the width of the damming portions 54a is reduced, the width of the liquid retaining portion 54b can be made relatively long, and therefore stability of the charge reaction and the discharge reaction tends to be improved in the entire electrode body 20. From this standpoint, the length of the damming portions 54a in the width direction X is preferably no greater than 20%, more preferably no greater than 15%, and particularly preferably no greater than 10%.

The type of the negative electrode active material used in the damming portions 54a is appropriately selected from the standpoint of appropriately switching closing and opening of the electrolyte solution passages 20d. Specifically, the damming portions 54a contain a negative electrode active material of which an electrical potential relative to the positive electrode active material is high and a ratio of expansion or contraction due to an increase or decrease in SOC is high, when compared to a negative electrode active material contained in the liquid retaining portion 54b. As a result of the damming portions 54a having such a configuration being formed, leakage of the nonaqueous electrolyte solution 30 to the outside of the electrode body 20 can be suppressed in the normal use range, and the nonaqueous electrolyte solution 30 can easily infiltrate into the electrode body 20 in the recovery range. The following describes reasons why these effects are exhibited.

First, in the present embodiment, a negative electrode active material of which the electrical potential relative to the positive electrode active material (lithium) is relatively high is contained in the damming portions 54a, and a negative electrode active material of which the electrical potential relative to the positive electrode active material is relatively low is contained in the liquid retaining portion 54b. When a battery including the negative electrode 50 having a such a configuration is charged, charge carriers are preferentially supplied to the damming portions 54a, and accordingly, the damming portions 54a expand earlier than the liquid retaining portion 54b. Furthermore, the ratio of expansion or contraction of the negative electrode active material contained in the damming portions 54a is higher than that of the negative electrode active material contained in the liquid retaining portion 54b. Therefore, in charging and discharging performed in medium to high SOC regions (the normal use range) in which the damming portions 54a sufficiently expand and expansion and contraction of the liquid retaining portion 54b occur, the damming portions 54a are thicker than the liquid retaining portion 54b and the electrolyte solution passages 20d are closed (see FIG. 3). As a result, a liquid retaining space R in which the liquid retaining portion 54b faces the separator 60 is formed, and leakage of the nonaqueous electrolyte solution 30 to the outside of the electrode body 20 is suppressed. On the other hand, in charging and discharging performed in a low SOC region in which the damming portions 54a expand and contract, the damming portions 54a become thinner than the liquid retaining portion 54b and the electrolyte solution passages 20d are opened (see FIG. 4). As a result, the liquid retaining space R communicates with the outside of the electrode body 20, and the nonaqueous electrolyte solution 30 flows between the inside and the outside of the electrode body 20. Therefore, in a case where the nonaqueous electrolyte solution 30 in the electrode body 20 has run short, it is possible to easily cause the nonaqueous electrolyte solution 30 to infiltrate into the electrode body 20 to solve high-rate degradation.

As described above, in the lithium-ion secondary battery 100 according to the present embodiment, closing and opening of the electrolyte solution passages 20d can be switched by very simple means, i.e., by adjusting SOC, and therefore a shortage of the nonaqueous electrolyte solution 30 in the electrode body 20 can be appropriately prevented. Accordingly, the lithium-ion secondary battery 100 according to the present embodiment can maintain favorable battery performance with high-rate degradation solved.

(6) Negative Electrode Active Materials Used in Respective Regions

Note that the negative electrode active materials respectively contained in the regions of the damming portions 54a and the liquid retaining portion 54b can be selected from conventionally known negative electrode active materials with no particular limitation so long as the effects of the technology disclosed herein are not hindered. Specifically, there is no particular limitation on the negative electrode active materials contained in the respective regions so long as the following two properties, i.e., "the electrical potential relative to the positive electrode active material" and "the ratio of expansion or contraction due to an increase or decrease in SOC" are higher in the damming portions 54a than in the liquid retaining portion 54b. The following describes examples of negative electrode active materials contained in the respective regions.

(a) Negative Electrode Active Material in Liquid Retaining Portion

First, from the standpoint of easily achieving the effects of the technology disclosed herein, it is preferable that the electrical potential of the negative electrode active material contained in the liquid retaining portion 54b relative to the positive electrode active material has a small absolute value and the ratio of expansion or contraction of the negative electrode active material due to an increase or decrease in SOC has a small absolute value. For example, in the case of the lithium-ion secondary battery 100, it is preferable to use, in the liquid retaining portion 54b, a negative electrode active material of which the electrical potential relative to Li is 0.01 V to 0.07 V (e.g., about 0.05 V) and the ratio of expansion or contraction due to an increase or decrease in SOC is 5% to 20% (e.g., about 12%). If a negative electrode active material of which the electrical potential relative to Li and the ratio of expansion or contraction have small absolute values is used in the liquid retaining portion 54b as described above, the range of choice of negative electrode active materials that can be used in the damming portions 54a can be increased. Examples of such negative electrode active materials include carbon-based active materials (graphite, hard carbon, soft carbon, etc.) that contain carbon (C). Also, the liquid retaining portion 54b is located in the center portion of the core portion 20a and serves as a site at which a charge reaction and a discharge reaction mainly occur as described above, and therefore it is preferable to use a negative electrode active material with which the charge reaction and the discharge reaction tend to stably occur. From this standpoint as well, carbon-based active materials are suitable as the negative electrode active material contained in the liquid retaining portion 54b.

(b) Negative Electrode Active Material in Damming Portions

It is preferable to use, in the damming portions 54a, a negative electrode active material of which the electrical potential relative to the positive electrode active material has a large absolute value and the ratio of expansion or contraction due to an increase or decrease in SOC has a large absolute value. For example, in a case where the liquid retaining portion 54b contains a carbon-based active material, the damming portions 54a preferably contain a negative electrode active material of which the electrical potential relative to the positive electrode active material (Li) is at least 0.1 V (preferably at least 0.2 V, more preferably at least 0.3 V, and particularly preferably at least 0.4 V). In this case, the damming portions 54a sufficiently expand at low SOC, and therefore it is possible to widen the normal use range in which charging and discharging can be performed while suppressing leakage of the nonaqueous electrolyte solution 30. Note that there is no particular limitation on the upper limit of the electrical potential of the negative electrode active material contained in the damming portions 54a relative to Li, and the upper limit may be 2.0 V or less, 1.5 V or more, 1.0 V or more, or 0.8 V or less.

Also, in the case where the liquid retaining portion 54b contains a carbon-based active material, the damming portions 54a preferably contain a negative electrode active material of which the ratio of expansion or contraction due to an increase or decrease in SOC is at least 50% (preferably at least 100%, more preferably at least 150%, and particularly preferably at least 200%). With this configuration, it is possible to ensure that the electrolyte solution passages 20d are closed during charging and discharging performed in the normal use range to suppress leakage of the nonaqueous electrolyte solution 30. Also, if a negative electrode active material having such a high ratio of expansion or contraction is contained in the damming portions 54a, the electrolyte solution passages 20d can be widely opened when charging and discharging are performed in the recovery range, and accordingly, infiltration of the nonaqueous electrolyte solution 30 into the electrode body 20 can be facilitated. Note that there is no particular limitation on the upper limit of the ratio of expansion or contraction of the negative electrode active material contained in the damming portions 54a, and the upper limit may be 500% or less or 400% or less. However, if the amount of expansion or contraction of the damming portions 54a due to variation in SOC is too large, there is a possibility of the battery capacity being reduced due to breakage of a conductive path. From this standpoint, the ratio of expansion or contraction of the negative electrode active material contained in the damming portions 54a is preferably no greater than 350%, and more preferably no greater than 320%.

Examples of materials that satisfy the conditions described above and are suitable as the negative electrode active material for the damming portions 54a include metal-based active materials that contain elements selected from the group consisting of silicon (Si), tin (Sn), antimony (Sb), and bismuth (Bi). Note that the metal-based active materials may be metal simple substances containing the elements listed above or compounds such as oxides. As shown in Table 1 given below, these metal-based active materials have high electrical potentials relative to Li and high ratios of expansion or contraction, and accordingly, if any of these materials is added to the damming portions 54a, the electrolyte solution passages 20d can be appropriately closed and opened by adjusting SOC. Note that, as shown in Table 1 given below, out of these metal-based active materials, an Si-based active material containing Si has a particularly high ratio of expansion or contraction due to an increase or decrease in SOC, and therefore is particularly suitable as the negative electrode active material for the damming portions 54a.

TABLE 1

|  | C | Si | Sn | Sb | Bi |
|---|---|---|---|---|---|
| Electrical potential vs Li (V) | 0.05 | 0.4 | 0.6 | 0.6 | 0.8 |
| Ratio of expansion or contraction (%) | 12 | 320 | 260 | 200 | 215 |

Note that not all negative electrode active materials contained in the damming portions 54a need to have a high electrical potential relative to the positive electrode active material and a high ratio of expansion or contraction due to an increase or decrease in SOC, when compared to the negative electrode active material contained in the liquid retaining portion 54b. For example, in a case where a carbon-based active material is used in the liquid retaining portion 54b, the effects of the technology disclosed herein can be exhibited even if a mixed material obtained by mixing a carbon-based active material and a metal-based active material is used in the damming portions 54a. If a carbon-based active material is contained in the damming portions 54a as described above, a charge reaction and a discharge reaction that occur in the damming portions 54a can be stabilized while the effects of the technology disclosed herein being appropriately exhibited.

Note that, from the standpoint of appropriately closing and opening the electrolyte solution passages 20d by adjusting SOC to appropriately prevent high-rate degradation, the amount of the metal-based active material relative to a total amount of negative electrode active materials contained in the damming portions 54a is preferably at least 0.5 wt %, more preferably at least 1 wt %, further preferably at least 1.5 wt %, and particularly preferably at least 2 wt %. On the other hand, from the standpoint of achieving the effects of the technology disclosed herein, there is no particular limitation on the upper limit value of the above-described amount of the metal-based active material. That is, the amount of the metal-based active material relative to the total amount of negative electrode active materials contained in the damming portions 54a may be 100 wt % (whole amount), 75 wt % or less, 50 wt % or less, 25 wt % or less, or 10 wt % or less. However, if the amount of expansion or contraction of the damming portions 54a is too large, there is a possibility of the capacity being reduced due to breakage of a conductive path. In view of this, the upper limit value of the amount of the metal-based active material is preferably 7.5 wt % or less, more preferably 5 wt % or less, further preferably 4 wt % or less, and particularly preferably 3 wt % or less.

2. Battery Module

Figure 5:
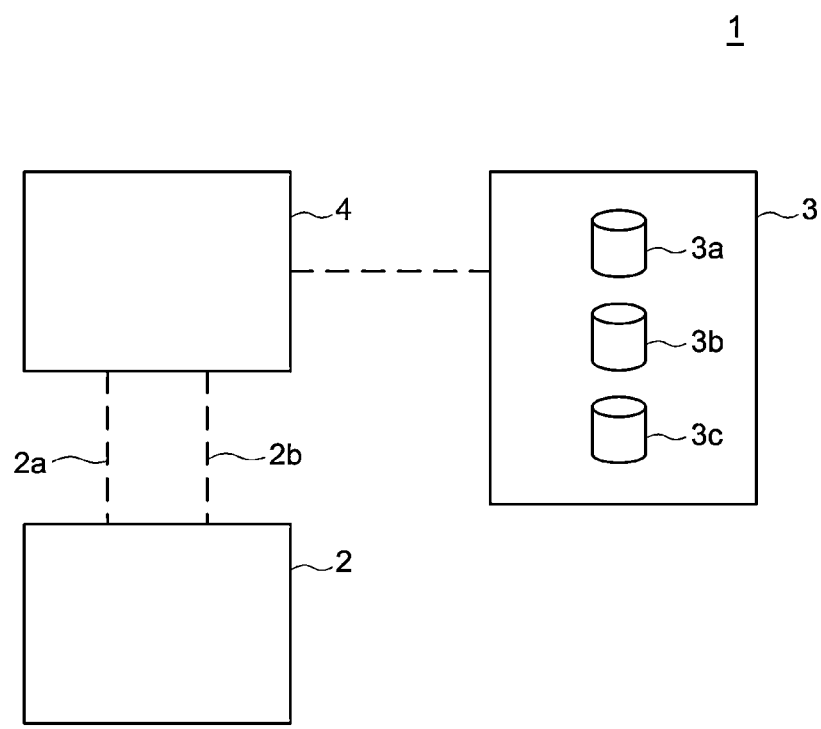
FIG. 5 is a block diagram showing a battery module according to an embodiment.
Figure 6:
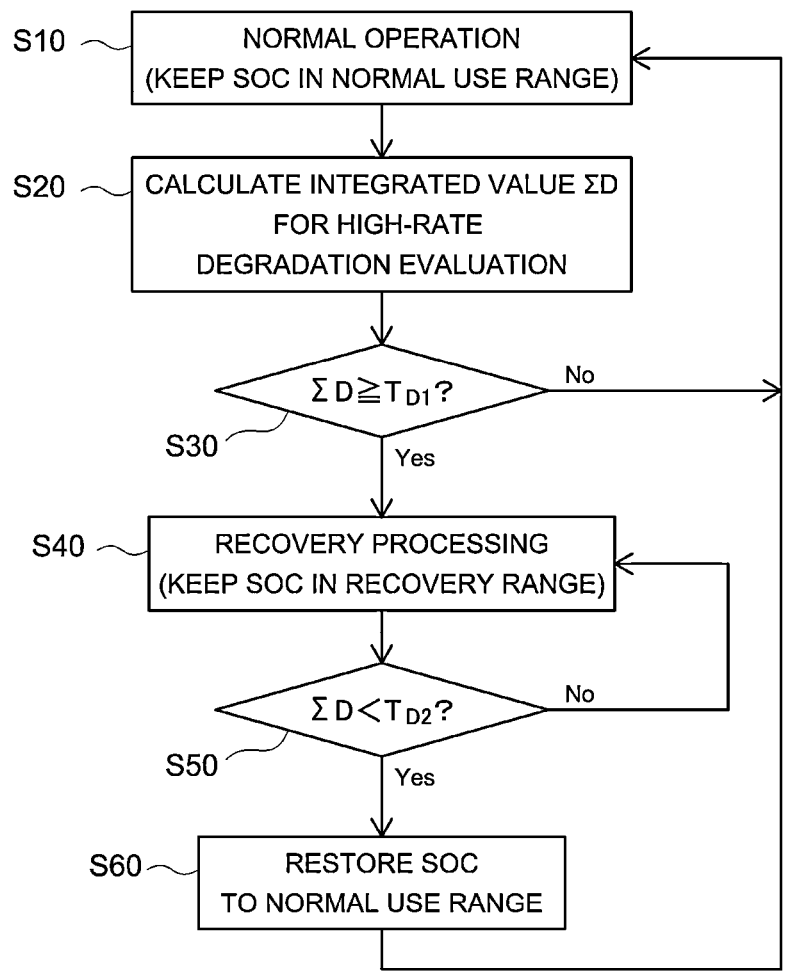
FIG. 6 is a flow chart showing SOC adjustment of the battery module according to the embodiment.
Figure 7:
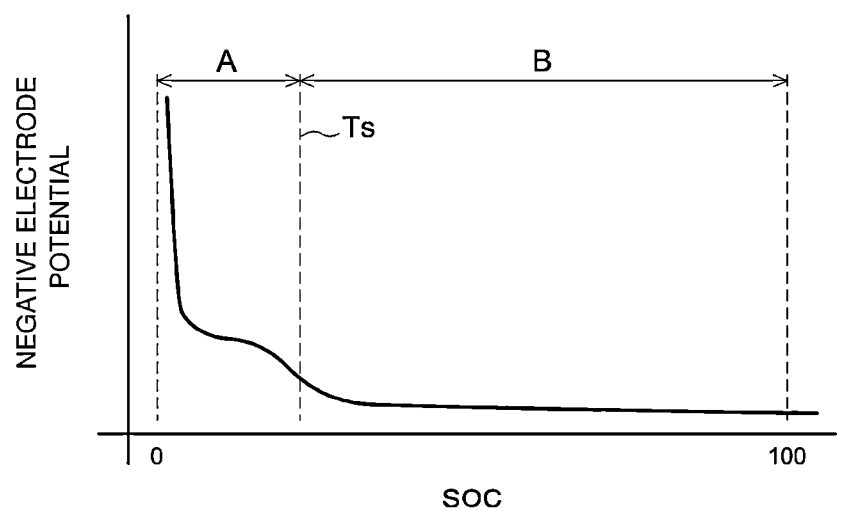
FIG. 7 is a graph showing a relationship between a negative electrode potential and SOC in charging of a secondary battery including damming portions and a liquid retaining portion.

Next, an example of a battery module that includes the lithium-ion secondary battery 100 according to the embodiment described above will be described. FIG. 5 is a block diagram showing a battery module according to the present embodiment. FIG. 6 is a flowchart showing charge and discharge control of the battery module according to the present embodiment. FIG. 7 is a graph showing a relationship between a negative electrode potential and SOC in charging of a secondary battery including damming portions and a liquid retaining portion.

As shown in FIG. 5, a battery module 1 according to the present embodiment includes a power supply 2 that is electrically connected to an external device 4 and a control unit 3 that controls charging and discharging of the power supply 2. The following describes each constitutional unit.

(1) Power Supply

The power supply 2 is electrically connected to the external device 4 via a positive electrode connection member 2a and a negative electrode connection member 2b. There is no particular limitation on the type of the external device 4, and the external device 4 may be, for example, an automobile such as an electric vehicle (EV) or a hybrid vehicle (HV) or an electronic device such as a personal computer or a portable terminal. The power supply 2 of the battery module 1 according to the present embodiment includes at least one lithium-ion secondary battery 100 according to the embodiment described above (see FIG. 1). Note that there is no particular limitation on the number of lithium-ion secondary batteries 100 included in the power supply 2, and the number of lithium-ion secondary batteries can be increased or reduced as appropriate according to power necessary to operate the external device 4. Note that in a case where a power supply 2 including a plurality of (e.g., three or more) lithium-ion secondary batteries 100 is to be built, it is preferable to form a battery pack in which the plurality of batteries are arranged in a predetermined direction and are bound along the arrangement direction. With this configuration, not only structural stability of the power supply 2 can be ensured but also charging and discharging of each battery can be stabilized. Note that the positive electrode connection member 2a is connected to the positive electrode terminal 72 of the lithium-ion secondary battery 100 (see FIG. 1) although specific illustration is omitted. Also, the negative electrode connection member 2b is connected to the negative electrode terminal 74 of the lithium-ion secondary battery 100.

(2) Control Unit

The control unit 3 is connected to the power supply 2 via the external device 4 and controls charging and discharging of the power supply 2 according to operation conditions of the external device 4. The control unit 3 can be embodied using a computer that operates following a predetermined program. Each function of the control unit 3 is processed by a calculation device (also called a processor, a CPU (Central Processing Unit), or an MPU (Micro-Processing Unit)) and a storage device (a memory, a hard disk, etc.) of each computer that constitutes the control unit 3. For example, each constitutional unit of the control unit 3 can be embodied as a database in which data embodied by the computer is stored in a predetermined form, a data structure, a processing module that performs predetermined calculation processing following a predetermined program, or a portion of any of the database, the data structure, and the processing module.

The control unit 3 in the present embodiment includes a degradation detection unit 3a, an SOC measurement unit 3b, and an SOC adjustment unit 3c. The degradation detection unit 3a, the SOC measurement unit 3b, and the SOC adjustment unit 3c can be embodied through cooperation between the computer that embodies the control unit 3 and various types of sensors. The following describes the constitutional units included in the control unit 3.

(a) Degradation Detection Unit

The degradation detection unit 3a is configured to detect high-rate degradation of the power supply 2. For example, the degradation detection unit 3a is preferably configured to calculate an evaluation value D that is a numerical value expressing a state of high-rate degradation (e.g., an increase in the battery resistance) of the power supply 2 due to high-rate charging and discharging. Such an evaluation value D can be calculated based on a current value of the power supply 2, SOC of the power supply 2, a temperature of the power supply 2, and a cycle time of charging and discharging. Note that procedures disclosed in WO 12/101678 and WO 13/046263 can be used as specific procedures for calculating the evaluation value D. Information (e.g., the evaluation value D) regarding high-rate degradation detected by the degradation detection unit 3a is transmitted to the SOC adjustment unit 3c, which will be described later.

(b) SOC Measurement Unit

The SOC measurement unit 3b is configured to measure SOC of the power supply 2. For example, information regarding current values during charging and discharging is provided to the SOC measurement unit 3b. The SOC measurement unit 3b can calculate SOC of the power supply 2 by integrating the current values. Note that the procedure for calculating SOC in the SOC measurement unit 3b is not limited to the procedure described above, and conventionally known procedures can be adopted with no particular limitation. For example, the SOC measurement unit 3b may also be configured to estimate SOC based on a negative electrode potential. The SOC calculated by the SOC measurement unit 3b is transmitted to the SOC adjustment unit 3c. Note that in a case where the degradation detection unit 3a uses SOC to detect high-rate degradation, the SOC of the power supply 2 calculated by the SOC measurement unit 3b is transmitted not only to the SOC adjustment unit 3c but also to the degradation detection unit 3a.

(c) SOC Adjustment Unit

The SOC adjustment unit 3c is configured to adjust SOC by controlling charging and discharging of the power supply 2. Here, during a period for which it is determined that high-rate degradation is not occurring in the power supply 2 based on a result of detection performed by the degradation detection unit 3a, the SOC adjustment unit 3c keeps SOC of the power supply 2 in the normal use range so that the damming portions 54a are thicker than the liquid retaining portion 54b (see FIG. 3). Thus, it is possible to charge and discharge the power supply 2 while suppressing leakage of the nonaqueous electrolyte solution 30 to the outside of the electrode body 20 by closing the electrolyte solution passages 20d. On the other hand, upon determining that high-rate degradation has occurred in the power supply 2 based on a result of detection performed by the degradation detection unit 3a, the SOC adjustment unit 3c reduces SOC of the power supply 2 to the recovery range so that the damming portions 54a become thinner than the liquid retaining portion 54b (see FIG. 4). As a result, the electrolyte solution passages 20d are opened, and therefore it becomes easy for the nonaqueous electrolyte solution 30 to infiltrate into the electrode body 20, and the high-rate degradation can be easily solved.

(3) Specific Example of SOC Control

The following describes a specific procedure of SOC control performed by the battery module 1 according to the present embodiment. As shown in FIG. 6, in the SOC control, the SOC adjustment unit 3c controls charging and discharging of the power supply 2 (the lithium-ion secondary battery 100) through six steps S10 to S60. Although the evaluation value D is adopted as a parameter for evaluating high-rate degradation in the following description, a specific parameter for evaluating high-rate degradation is not limited to the evaluation value D.

(a) Step S10

The SOC adjustment unit 3c keeps SOC of the power supply 2 in the normal use range while the external device 4 is normally operating (step S10). Specifically, while the external device 4 is normally operating, the SOC adjustment unit 3c continuously compares a measurement result of the SOC measurement unit 3b (i.e., SOC of the power supply 2) and a preset SOC reference value $T_S$ (see FIG. 7). If SOC of the power supply 2 becomes smaller than the SOC reference value $T_S$ and falls in the recovery range A during execution of step S10, charging and discharging of the power supply 2 is forcibly switched to charging to increase SOC to the normal use range B. SOC of the power supply 2 can be kept in the normal use range B as a result of control being performed as described above. As a result of SOC being kept in the normal use range B as described above, charging and discharging can be performed in a state where the electrolyte solution passages 20d are closed by the damming portions 54a, and therefore leakage of the nonaqueous electrolyte solution 30 to the outside of the electrode body 20 can be suppressed (see FIG. 3).

Note that, in the present specification, the "normal use range" refers to a charge state in the medium to high SOC regions in which volumes of the damming portions hardly change in a state where the damming portions have sufficiently expanded, and expansion and contraction of the liquid retaining portion occur. On the other hand, the "recovery range" refers to a charge state in the low SOC region in which the volume of the liquid retaining portion hardly changes in a state where the liquid retaining portion has sufficiently contracted, and expansion and contraction of the damming portions occur. The normal use range and the recovery range can be appropriately set according to electrical potentials of the negative electrode active materials respectively contained in the liquid retaining portion and the damming portions. Specifically, when a secondary battery including a negative electrode that includes the liquid retaining portion and the damming portions is charged or discharged, the negative electrode potential rapidly changes in the low SOC region and the change in the negative electrode potential becomes moderate in the medium to high SOC regions as shown in FIG. 7. This is because charge carriers are rapidly supplied to the damming portions in the low SOC region, and thereafter charge carriers are gradually supplied to the liquid retaining portion in the medium to high SOC regions. Based on such characteristic changes in the electrical potential, the "recovery range A" of the low SOC region and the "normal use range B" of the medium to high SOC regions can be set.

Also, the "SOC reference value $T_S$" used in the SOC control performed in step S10 is a value that defines a boundary between the recovery range A and the normal use range B. For example, the "SOC reference value $T_S$" may be set to SOC that corresponds to a median value between the electrical potential of the negative electrode active material used in the damming portions 54a and the electrical potential of the negative electrode active material used in the liquid retaining portion 54b. Also, the "SOC reference value $T_S$" may be set to be higher than SOC of a point in time later than which a rapid change in the negative electrode potential is no longer observed. In this case, it is possible to reliably prevent the nonaqueous electrolyte solution 30 from leaking as a result of the damming portions 54a contracting during normal operation in the normal use range B. In a case where a lithium-nickel-cobalt-manganese complex oxide is used in the positive-electrode composite material layer 44, a carbon-based active material is used in the liquid retaining portion 54b, and a mixed material of a carbon-based active material and an Si-based active material is used in the damming portions 54a, for example, the SOC reference value $T_S$ is preferably set in the range of SOC: 20% to 40% (more preferably, SOC: 25% to 35%, e.g., SOC: 30%).

(b) Step S20

While the external device 4 is normally operating, the SOC adjustment unit 3c calculates an integrated value ΣD of the evaluation value D with respect to every predetermined unit period (step S20). Specifically, the degradation detection unit 3a calculates the evaluation value D indicating the state of high-rate degradation of the power supply 2 and transmits a calculation result to the SOC adjustment unit 3c as described above. The SOC adjustment unit 3c calculates an integrated value ΣD of received evaluation values D and uses the integrated value in determination regarding switching between normal operation and recovery processing, which will be described later. Here, it is preferable that a target value is set with respect to the evaluation value D, and the SOC adjustment unit 3c is configured to use only evaluation values D that exceed the target value in calculation of the integrated value D. In this case, evaluation values D that are obtained in a state where high-rate degradation is not occurring in the power supply 2 can be prevented from being used in degradation determination that is performed in step S30.

(c) Step S30

Next, the SOC adjustment unit 3c determines whether or not the integrated value ΣD of the evaluation value D is greater than a degradation determination reference value $T_{D1}$ (step S30). If the integrated value ΣD is smaller than the degradation determination reference value $T_{D1}$ (ΣD<$T_{D1}$), the processing returns to step S10 and normal operation of the external device 4 is continued. On the other hand, if the integrated value ΣD is greater than or equal to the degradation determination reference value $T_{D1}$ (ΣD≥$T_{D1}$), the SOC adjustment unit 3c determines that the nonaqueous electrolyte solution 30 has run short in the electrode body 20 and high-rate degradation is progressing, stops normal operation of the external device 4, and proceeds to step S40. Note that the degradation determination reference value $T_{D1}$ is a numerical value that expresses an extent of high-rate degradation that can be allowed in normal operation of the external device 4. The degradation determination reference value $T_{D1}$ can be set to a suitable value based on a result of a preliminary test in which a correlation between the integrated value ΣD of the evaluation value and performance (e.g., a resistance value) of the power supply 2 is examined and performance required for normal operation of the external device 4, for example.

(d) Step S40

In step S40, the SOC adjustment unit 3c reduces SOC of the power supply 2 to be smaller than the SOC reference value $T_S$ (see FIG. 7). Specifically, the SOC adjustment unit 3c compares the SOC reference value $T_S$ and SOC of the power supply 2 and discharges the power supply 2 until SOC of the power supply 2 becomes smaller than the SOC reference value $T_S$ and falls in the recovery range A. Then, the SOC adjustment unit 3c controls charging and discharging such that SOC of the power supply 2 is kept in the recovery range A. In other words, the SOC adjustment unit 3c controls charging and discharging of the power supply 2 while adjusting SOC so as not to be greater than the SOC reference value $T_S$. As a result, a state where the electrolyte solution passages 20d are open as shown in FIG. 4 is maintained, and therefore the nonaqueous electrolyte solution 30 infiltrates into the electrode body 20 and it is possible to recover from high-rate degradation.

Also, while executing the recovery processing, the SOC adjustment unit 3c continuously executes mitigation correction on the integrated value ΣD of the evaluation value based on evaluation values D transmitted from the degradation detection unit 3a. Specifically, when high-rate degradation is solved through the recovery processing, the evaluation value D acquired by the degradation detection unit 3a decreases. During execution of the recovery processing, the SOC adjustment unit 3c calculates a reduction amount of the evaluation value D based on the evaluation value D transmitted from the degradation detection unit 3a and continuously executes mitigation correction by reducing the integrated value ΣD based on the reduction amount of the evaluation value D.

(e) Steps S50 and S60

The SOC adjustment unit 3c determines whether or not the integrated value ΣD of the evaluation value reduced through the above-described mitigation correction is smaller than a recovery determination reference value $T_{D2}$ with respect to every predetermined unit period (step S50). While the integrated value ΣD of the evaluation value is greater than the recovery determination reference value $T_{D2}$ (ΣD≥$T_{D2}$), it is determined that the power supply 2 has not sufficiently recovered (high-rate degradation has not sufficiently been solved), the processing returns to step S40 and the recovery processing and the mitigation correction of the integrated value ΣD are continued. On the other hand, if the integrated value ΣD of the evaluation value is smaller than the recovery determination reference value $T_{D2}$ (ΣD<$T_{D2}$), the SOC adjustment unit 3c determines that high-rate degradation of the power supply 2 has been sufficiently solved, and stops the recovery processing. Then, the SOC adjustment unit 3c compares the SOC reference value $T_S$ and SOC of the power supply 2 and charges the power supply 2 until SOC of the power supply 2 becomes greater than the SOC reference value $T_S$ and falls in the normal use range B (step S60). Then, the SOC adjustment unit 3c returns to step S10 and restarts normal operation.

Note that the recovery determination reference value $T_{D2}$ is a reference value for determining whether or not high-rate degradation of the power supply 2 has been solved through the recovery processing. The recovery determination reference value $T_{D2}$ is preferably smaller than the degradation determination reference value $T_{D1}$ used in step S30. In this case, normal operation can be restarted after high-rate degradation of the power supply 2 is sufficiently solved, and therefore it is possible to appropriately prevent a reduction in operation efficiency due to frequent switching between normal operation and the recovery processing.

As described above, in the battery module 1 according to the present embodiment, normal operation and the recovery processing can be appropriately switched according to the state of high-rate degradation of the power supply 2 to close or open the electrolyte solution passages 20d of the electrode body 20. Therefore, according to the present embodiment, a shortage of the nonaqueous electrolyte solution 30 in the electrode body 20 can be prevented and the power supply 2 can be used with favorable battery performance maintained. In other words, with the battery module 1 according to the present embodiment, it is possible to normally operate the external device 4 while suppressing leakage of the nonaqueous electrolyte solution 30 and to easily execute the recovery processing for causing the nonaqueous electrolyte solution 30 to infiltrate into the electrode body 20 when high-rate degradation of the power supply 2 has progressed.

Note that the nonaqueous electrolyte secondary battery disclosed herein is not configured based on a precondition that the nonaqueous electrolyte secondary battery is used in the battery module 1 configured as described above. For example, the effects of the nonaqueous electrolyte secondary battery disclosed herein can be sufficiently exhibited even if processing for switching between normal operation and the recovery processing based on the extent of high-rate degradation is not performed. Specifically, the effects of the nonaqueous electrolyte secondary battery disclosed herein can be sufficiently exhibited even in a case where processing for switching between normal operation and the recovery processing according to an operation period of the external device is performed and a case where processing for executing the recovery processing at a specific time (e.g., the nighttime) in a day is performed.

3. Other Embodiments

One embodiment of the technology disclosed herein has been described. Note that the embodiment described above is an example to which the technology disclosed herein is applied, and is not intended to limit the technology disclosed herein.

For example, in the embodiment described above, the wound electrode body 20 (see FIG. 2) obtained by layering and winding the positive electrode 40, the negative electrode 50, and the separators 60 is used as the electrode body. However, the electrode body only needs to be an electrode body in which a positive electrode, a negative electrode, and a separator are overlaid on each other, and is not limited to the wound electrode body 20 shown in FIG. 2. An example of an electrode body having another structure is a laminate electrode body 20A (see FIG. 8) that is obtained by stacking a plurality of positive electrodes and a plurality of negative electrodes and interposing separators between the positive electrodes and the negative electrodes. In the laminate electrode body 20A, electrolyte solution passages 20d are formed not only in both end portions in the width direction X but also in an upper end portion and a lower end portion in the height direction Z. Therefore, in a case where the technology disclosed herein is applied to a nonaqueous electrolyte secondary battery that includes the laminate electrode body 20A, it is preferable to form damming portions 54a in outer peripheral edge portions of the negative-electrode composite material layer 54 in each of the plurality of stacked negative electrodes 50.

Figure 8:
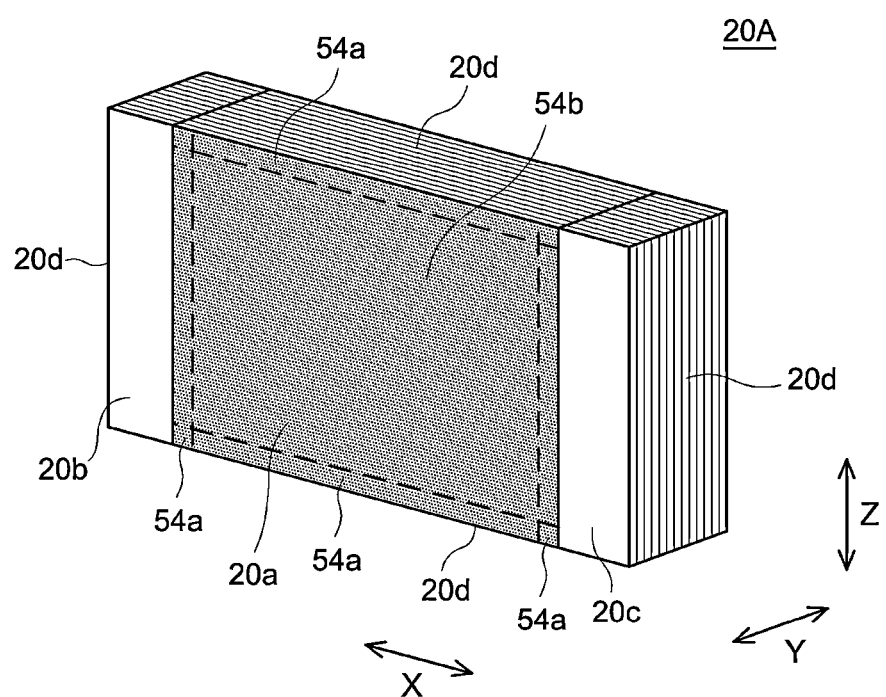
FIG. 8 is a perspective view schematically showing an electrode body of a lithium-ion secondary battery according to another embodiment.

Note that the number of electrolyte solution passages 20d in the wound electrode body 20 shown in FIG. 2 is smaller than the number of electrolyte solution passages 20d in the laminate electrode body 20A shown in FIG. 8. Also, there is a possibility that the distance between the positive electrode 40 and the negative electrode 50 is reduced in the wound electrode body 20 due to tension applied when the electrodes are wound. For these reasons, infiltration of the nonaqueous electrolyte solution tends to be more difficult in the wound electrode body 20 than in the laminate electrode body 20A. In view of this, the technology disclosed herein is preferably applied to a nonaqueous electrolyte secondary battery including the wound electrode body 20 because the technology facilitates infiltration of the nonaqueous electrolyte solution into the electrode body.

As described above, the lithium-ion secondary battery 100 is used in the present specification as an embodiment of the technology disclosed herein. However, batteries to which the technology disclosed herein can be applied are not limited to lithium-ion secondary batteries, and the technology can also be applied to nonaqueous electrolyte secondary batteries of other types (e.g., a nickel hydrogen battery).

TEST EXAMPLE

The following describes a test example regarding the technology disclosed herein. Note that contents of the test example described below are not intended to limit the technology disclosed herein.

1. Production of Samples

In the test example, five types of lithium-ion secondary batteries (samples 1 to 5) that differ from each other in the composition of the negative-electrode composite material layer were prepared, and conditions suitable for suppressing leakage of the nonaqueous electrolyte solution were examined. The following describes the samples.

(1) Sample 1

In the test example, first, a wound electrode body in which a coating width of composite material layers was 100 mm and that had a height dimension of 50 mm was produced. Specifically, a band-shaped negative electrode was prepared by coating both surfaces of a negative-electrode current collecting foil (a copper foil) with negative-electrode composite material layers. Note that negative electrode active materials, a binder (SBR), and a thickener (CMC) were added to the negative-electrode composite material layers. In sample 1, damming portions having a width of 10 mm (10% of the entire width of the electrode body) were formed in both end portions in the width direction of each negative-electrode composite material layer, and the remaining portion of the negative-electrode composite material layer was formed as a liquid retaining portion. Note that graphite was used as a negative electrode active material in the liquid retaining portion, and a mixed material of graphite and Si (Si addition amount: 0.5 wt %) was used as a negative electrode active material in the damming portions. On the other hand, a positive electrode was formed by coating both surfaces of a positive-electrode current collecting foil (an aluminum foil) with positive-electrode composite material layers. Note that a positive electrode active material ($LiNi_{0.33}Co_{0.33}Mn_{0.33}O_2$: lithium-nickel-cobalt-manganese complex oxide), a conductive material (AB), and a binder (PVdF) were added to the positive-electrode composite material layers. Then, the positive electrode and the negative electrode having the above-described configurations were stacked via separators (three-layer sheets constituted by PP-PE-PP) to form a laminate, and the laminate was wound to produce a wound electrode body.

The wound electrode body having the above-described configuration was housed in a battery case made of aluminum to build a battery assembly. A nonaqueous electrolyte solution was introduced into the case of the battery assembly and thereafter the case was sealed to build a lithium-ion secondary battery (sample 1) for an evaluation test. Note that, in the nonaqueous electrolyte solution, a supporting electrolyte ($LiPF_6$) was contained at a concentration of about 1 mol/L in a mixed solvent that contained EC, DMC, and EMC at a volume ratio of 3:4:3.

(2) Samples 2 to 4

In samples 2 to 4, lithium-ion secondary batteries for the test were built using negative electrodes in which damming portions were formed in both end portions in the width direction of the negative-electrode composite material layers similarly to sample 1. Graphite was used as the negative electrode active material in the liquid retaining portion, and a mixed material of graphite and Si was used as the negative electrode active material in the damming portions. Note that, in samples 2 to 4, the lithium-ion secondary batteries for the test were built under the same conditions as those in production of sample 1 other than that a mixing ratio between graphite and Si in the damming portions was changed from that in sample 1. Si addition amounts in the damming portions of respective samples are shown in Table 2.

(3) Sample 5

In sample 5, a lithium-ion secondary battery for the test was built under the same conditions as those in production of sample 1 other than that a negative electrode in which damming portions were not formed (only graphite was used as the negative electrode active material in entire regions of the negative-electrode composite material layers) was used.

2. Evaluation Test (1) Cycle Test

First, after the battery for the test was produced in each sample, the battery for the test was bound. Then, initial charging was performed on the bound battery, and thereafter a cycle test was performed. Specifically, initial charging was performed by charging the battery under an environment at 25° C. until SOC reached 80%. Then, the cycle test was performed by repeating rectangular wave cycles 1000 times, each rectangular wave cycle being carried out by performing pulse discharging at a constant current of 10 C until SOC reached 30%, taking a pause for 5 seconds, performing pulse charging at 10 C until SOC reached 80%, and taking a pause for 5 seconds.

(2) Battery Resistance Evaluation

A battery resistance after the initial charging described above (a battery resistance before the cycle test) and a battery resistance after the cycle test were measured and a "resistance increase ratio between before and after the cycle test" was calculated. Specifically, after SOC of the battery for the test was adjusted to 50%, the battery was discharged under an environment of 25° C. for 10 seconds. At this time, a discharge current rate was set to 2 C, 5 C, 10 C, and 20 C, and voltages after the battery was discharged at the respective current rates were measured. Then, IV resistances were calculated based on voltage measurement results and the current rates, and an average value of the IV resistances was taken to be a battery resistance. Then, a ratio "battery resistance after test/battery resistance before test" between the battery resistance before the cycle test and the battery resistance after the cycle test was calculated as the "resistance increase ratio between before and after the cycle test". Resistance increase ratios of the respective samples are shown in corresponding cells in Table 2.

(2) Battery Capacity Evaluation

A battery capacity after the initial charging described above (a battery capacity before the cycle test) and a battery capacity after the cycle test were measured and a "capacity reduction ratio between before and after the cycle test" was calculated. Specifically, constant-current constant-voltage (CCCV) discharging was performed by discharging the battery, which had been charged until SOC reached 80%, at a constant current of 1 C until SOC reached 30%, and a discharge capacity was measured at this time as a battery capacity. Then, a ratio "battery capacity after test/battery capacity before test" between the battery capacity before the cycle test and the battery capacity after the cycle test was calculated as the "capacity reduction ratio between before and after the cycle test". Capacity reduction ratios of the respective samples are shown in corresponding cells in Table 2.

due to breakage of a conductive path as a result of the amount of expansion or contraction of the damming portions being too large.

Although the present disclosure has been described in detail, the above description is merely for illustrative purpose. That is, various alterations and modifications of the specific example described above are included in the technology disclosed herein.

What is claimed is:

1. A battery module comprising:
    a power supply configured to be electrically connected to an external device; and
    a control unit configured to control charging and discharging of the power supply, wherein
    the power supply includes a nonaqueous electrolyte secondary battery,
    the nonaqueous electrolyte secondary battery includes:
        an electrode body in which a positive electrode, a negative electrode, and a separator are overlaid on each other; and
        a nonaqueous electrolyte solution that infiltrates into the electrode body, wherein
    the positive electrode is formed by coating a surface of a band-shaped positive-electrode current collecting foil with a positive-electrode composite material layer that contains a positive electrode active material,
    the negative electrode is formed by coating a surface of a band-shaped negative-electrode current collecting foil with a negative-electrode composite material layer that contains a negative electrode active material,

TABLE 2

| | Configuration of negative-electrode composite material layer | | | | | | | | | | |
|---|---|---|---|---|---|---|---|---|---|---|---|
| | Liquid retaining portion | | Damming portion | | | | | | | Evaluation test | |
| | | | First component | | | Second component | | | | | |
| | | | Ratio of | | | Ratio of | | | Ratio of | | |
| | Component name | Potential (vs. Li) | expansion or contraction (%) | Component name | Potential (vs. Li) | expansion or contraction (%) | Component name | Potential (vs. Li) | expansion or contraction (%) | Content | Resistance increase ratio | Capacity reduction ratio |
| Sample 1 | C | 0.05 | 12 | C | 0.05 | 12 | Si | 0.4 | 320 | 0.5 | 1.18 | 0.98 |
| Sample 2 | C | 0.05 | 12 | C | 0.05 | 12 | Si | 0.4 | 320 | 1.0 | 1.14 | 0.98 |
| Sample 3 | C | 0.05 | 12 | C | 0.05 | 12 | Si | 0.4 | 320 | 3.0 | 1.12 | 0.97 |
| Sample 4 | C | 0.05 | 12 | C | 0.05 | 12 | Si | 0.4 | 320 | 5.0 | 1.12 | 0.94 |
| Sample 5 | C | 0.05 | 12 | C | 0.05 | 12 | — | — | — | — | 1.21 | 0.97 |

As shown in Table 2, the resistance increase ratios between before and after the cycle test of samples 1 to 4 were lower than that of sample 5. This result shows that high-rate degradation due to leakage of the nonaqueous electrolyte solution could be suppressed as a result of the damming portions containing a negative electrode active material (in this example, Si) of which the electrical potential relative to the positive electrode active material was high and the ratio of expansion or contraction was high, when compared to the negative electrode active material contained in the liquid retaining portion. On the other hand, it was confirmed that there was a tendency for the battery capacity to easily decrease in sample 4, when compared to the other samples. This is presumably because isolation of Li occurred the electrode body includes an electrolyte solution passage that is a flow passage through which the nonaqueous electrolyte solution flows between the inside and the outside of the electrode body, and
a region of the negative-electrode composite material layer that is in contact with the electrolyte solution passage is a damming portion, and a region of the negative electrode composite material layer that is located on a center side relative to the damming portion is a liquid retaining portion,
the damming portion contains a negative electrode active material of which an electrical potential relative to the positive electrode active material is high and a ratio of expansion or contraction due to an increase or decrease in SOC is high, when compared to a negative electrode active material contained in the liquid retaining portion, the control unit includes:

a degradation detection unit that detects high-rate degradation of the power supply;

an SOC measurement unit that measures SOC of the power supply; and an SOC adjustment unit that adjusts the SOC by controlling charging and discharging of the power supply, during a period for which it is determined that the high-rate degradation is not occurring based on a result of detection performed by the degradation detection unit, the SOC adjustment unit maintains SOC of the power supply so that the damming portion is thicker than the liquid retaining portion, and upon determining that the high-rate degradation has occurred based on a result of detection performed by the degradation detection unit, the SOC adjustment unit reduces SOC of the power supply so that the damming portion becomes thinner than the liquid retaining portion.

2. The battery module according to claim 1, wherein the SOC measurement unit measures SOC of the power supply by integrating current values during charging and discharging of the power supply.

3. The battery module according to claim 1, wherein the degradation detection unit calculates an evaluation value D that is a numerical value expressing high-rate degradation of the power supply, during a period for which an integrated value $\Sigma D$ of the evaluation value D is smaller than a degradation determination reference value $T_{D1}$, the SOC adjustment unit adjusts SOC of the power supply so that the damming portion is thicker than the liquid retaining portion, and when the integrated value $\Sigma D$ of the evaluation value D exceeds the degradation determination reference value $T_{D1}$, the SOC adjustment unit reduces SOC of the power supply so that the damming portion becomes thinner than the liquid retaining portion.

* * * * *